United States Patent
Balasubramonian et al.

(10) Patent No.: US 10,303,622 B2
(45) Date of Patent: May 28, 2019

(54) DATA WRITE TO SUBSET OF MEMORY DEVICES

(71) Applicant: Hewlett Packard Enterprise Development LP, Houston, TX (US)

(72) Inventors: Rajeev Balasubramonian, Palo Alto, CA (US); Naveen Muralimanohar, Santa Clara, CA (US); Gregg B. Lesartre, Fort Collins, CO (US); Paolo Faraboschi, Palo Alto, CA (US); Jishen Zhao, San Jose, CA (US)

(73) Assignee: HEWLETT PACKARD ENTERPRISE DEVELOPMENT LP, Houston, TX (US)

( * ) Notice: Subject to any disclaimer, the term of this patent is extended or adjusted under 35 U.S.C. 154(b) by 110 days.

(21) Appl. No.: 15/500,460

(22) PCT Filed: Mar. 6, 2015

(86) PCT No.: PCT/US2015/019180
§ 371 (c)(1),
(2) Date: Jan. 30, 2017

(87) PCT Pub. No.: WO2016/144291
PCT Pub. Date: Sep. 15, 2016

(65) Prior Publication Data
US 2017/0220488 A1    Aug. 3, 2017

(51) Int. Cl.
*G06F 21/00* (2013.01)
*G06F 12/14* (2006.01)
(Continued)

(52) U.S. Cl.
CPC .......... *G06F 12/1408* (2013.01); *G06F 3/064* (2013.01); *G06F 3/0619* (2013.01);
(Continued)

(58) Field of Classification Search
None
See application file for complete search history.

(56) References Cited

U.S. PATENT DOCUMENTS 7,386,663 B2 * 6/2008 Cousins ............ G06F 17/30067
711/114
8,117,137 B2   2/2012 Xu et al.
(Continued)

FOREIGN PATENT DOCUMENTS

WO    WO-2011020902    2/2011
WO    WO-12082880      6/2012

OTHER PUBLICATIONS

Chen, Jim et al. Reliability-Availability-Serviceability Characteristics of a Compressed-Memory System. Proceeding International Conference on Dependable Systems and Networks. DSN 2000. https://ieeexplore.ieee.org/stamp/stamp.jsp?tp=&arnumber=857530 (Year: 2000).*

(Continued)

*Primary Examiner* — Jeremiah L Avery
(74) *Attorney, Agent, or Firm* — Hewlett Packard Enterprise Patent Department (57) ABSTRACT

Techniques for writing data to a subset of memory devices are described. In one aspect, a block of data to be written to a line in a rank of memory may be received. The rank of memory may comprise a set of memory devices. The block of data may be compressed. The compressed block of data may be written to a subset of the memory devices that comprise the line. The unwritten portions of the line may not be used to store valid data.

14 Claims, 6 Drawing Sheets

(51) Int. Cl.
*H03M 7/30* (2006.01)
*G06F 3/06* (2006.01)
*G06F 11/10* (2006.01)
*H03M 13/09* (2006.01)

(52) U.S. Cl.
CPC .......... *G06F 3/0623* (2013.01); *G06F 3/0673* (2013.01); *G06F 11/1012* (2013.01); *G06F 11/1044* (2013.01); *H03M 7/30* (2013.01); *H03M 7/6047* (2013.01); *G06F 2212/1052* (2013.01); *G06F 2212/402* (2013.01); *H03M 13/09* (2013.01)

(56) References Cited

U.S. PATENT DOCUMENTS

| | | | |
|---|---|---|---|
| 8,880,836 | B2 | 11/2014 | Owa et al. |
| 2002/0029360 | A1 | 3/2002 | Keeth |
| 2009/0019321 | A1* | 1/2009 | Radke ................ G06F 11/1072 714/54 |
| 2010/0031031 | A1* | 2/2010 | Tian .................... H04L 63/06 713/156 |
| 2011/0307471 | A1 | 12/2011 | Sheinin |
| 2011/0320913 | A1 | 12/2011 | Stracovsky et al. |
| 2012/0072641 | A1* | 3/2012 | Suzuki ................ G06F 3/0608 711/103 |
| 2012/0203951 | A1* | 8/2012 | Wood .................. G11C 16/28 711/102 |
| 2012/0216096 | A1* | 8/2012 | Seo ..................... H03M 7/30 714/763 |
| 2013/0117630 | A1 | 5/2013 | Kang |
| 2013/0132652 | A1* | 5/2013 | Wood ................ G06F 12/0246 711/103 |
| 2014/0101514 | A1 | 4/2014 | Cho et al. |
| 2015/0006594 | A1* | 1/2015 | Volvovski ......... G06F 17/30194 707/827 |
| 2015/0039969 | A1* | 2/2015 | Motwani .............. G06F 3/067 714/766 |
| 2015/0067436 | A1* | 3/2015 | Hu ..................... G06F 11/1008 714/758 |
| 2015/0169238 | A1* | 6/2015 | Lee .................... G06F 12/0871 711/103 |
| 2015/0193309 | A1* | 7/2015 | Khadiwala .......... G06F 11/1435 714/4.11 |

OTHER PUBLICATIONS

Kim, Chang-Su et al. An Error Detection and Recovery Algorithm for Compressed Video Signal Using Source Level Redundancy. IEEE Transactions on Image Processing, vol. 9, Issue: 2. https://ieeexplore.ieee.org/stamp/stamp.jsp?tp=&arnumber=821732 (Year: 2000).*

Chen, Long et al. Free ECC: An Efficient Error Protection for Compressed Last-Level Caches. 2013 IEEE 31st International Conference on Computer Design (ICCD). https://ieeexplore.ieee.org/stamp/stamp.jsp?tp=&arnumber=6657054 (Year: 2013).*

Weidmann, Claudio, et al. Combined Sequential Decoding and Error Concealment of H.264 Video. 2004 IEEE 6th Workshop on Multimedia Signal Processing. https://ieeexplore.ieee.org/stamp/stamp.jsp?tp=&arnumber=1436552 (Year: 2004).*

Aggarwal, Ashish, et al. Efficient Bit-Rate Scalability for Weighted Squared Error Optimization in Audio Coding. IEEE Transactions on Audio, Speech, and Language Processing, vol. 14, Issue: 4. https://ieeexplore.ieee.org/stamp/stamp.jsp?tp=&arnumber=1643658 (Year: 2006).*

Hadar, Ofer, et al. Hybrid Error Concealment with Automatic Error Detection for Transmitted MPEG-2 Video Streams over Wireless Communication Network. 2006 International Conference on Information Technology: Research and Education. https://ieeexplore.ieee.org/stamp/stamp.jsp?tp=&arnumber=4266304 (Year: 2006).*

Barr et al ~"Energy Aware Lossless Data Compression"~ https://www.usenix.org ~ May 2003 ~ 19 pages.

Hajimiri et al~"Content-aware Encoding for Improving Energy Efficiency in Multi-Level Cell Resistive Random Access Memory"~http://esl.cise.ufl.edu ~ 2013 ~ 6 pages.

International Searching Authority, The International Search Report and the Written Opinion, PCT/US2015/019180, dated Feb. 23, 2016, 12 Pages.

Pekhimenko et al~"Linearly Compressed Pages: A Low-Complexity, Low-Latency Main Memory Compression Framework"~MICRO-46~12/ 2013~13 pgs.

Shafiee et al., "MemZip: Exploring Unconventional Benefits from Memory Compression", Proceedings of HPCA, 2014, 12 Pages.

Pekhimenko et al., "Base-Delta-Immediate Compression: Practical Data Compression for On-Chip Caches", Minneapolis, Minnesota, USA, Sep. 2012, pp. 377-388.

International Preliminary Report on Patentability received for PCT Application No. PCT/US2015/019180, dated Sep. 21, 2017, 11 pages.

* cited by examiner

DATA WRITE TO SUBSET OF MEMORY DEVICES

BACKGROUND

Electronic devices, such as computers, may include memory. For example, a computer may include static random access memory (SRAM) and dynamic random access memory (DRAM). SRAM and DRAM share the characteristic power must be continuously supplied in order to retain data stored in the memory. If the power is removed, the stored data may be lost. Another type of memory that is becoming more prevalent is non-volatile random access memory (NVRAM). NVRAM may have the characteristic that once data is stored to the NVRAM, the data remains persistent, even if power is no longer supplied to the device.

BRIEF DESCRIPTION OF THE DRAWINGS

FIGS. 3(a-c) depict examples of write/read patterns in accordance with the data writing techniques described herein.

FIG. 5(a,b) depicts another example high level flow diagram of the data writing techniques described herein.

DETAILED DESCRIPTION

As mentioned above, some memory components in an electronic device, such a SRAM and DRAM require power in order to maintain storage of data. Other devices, such as NVRAM are able to store data without the need to continuously supply power. However, even though power is not needed to retain the persistence of the data, power is needed when the data is originally written. Currently existing forms of NVRAM (e.g. FLASH memory as well as types of NVRAM currently being developed (e.g. memristor, phase change RAM, spin torque transfer RAM) do not require the continuous supply of power in order to maintain the persistence of data stored thereon. However, these devices do use power when originally writing the data to the device. This use of power may be referred to as write energy, it should be understood that SRAM and DRAM also require write energy to store data, and as such the techniques described herein are equally applicable to SRAM and DRAM.

Many electronic devices, such as computers, include a memory controller to manage storing and retrieving data from memory. The memory controller may not individually read and write bytes of data from the memory. Rather, the memory controller may operate on groups of bytes, referred to as a line of data. For example, in a computer, memory is typically operated on in units equivalent to the size of a cacheline in the processor. For example, if a processor has a cacheline size of 64 bytes, the memory controller may receive/provide data to the processor in units of 64 bytes. However, techniques described herein are not limited to any particular cacheline size. For the remainder of this description a line may refer to a data block that is provided to the memory controller to be written to memory or is provided by the memory for use by the electronic device. The techniques described herein are not limited to any particular line size.

The memory may be divided across several memory devices which may be referred to as a rank. For example, for a given line, the memory devices that store the data that make up the line are all in the same rank. A rank of memory devices may store multiple lines. For example, for a 64 byte line, there may be 9 memory devices in the rank. Each of the first 8 memory devices (e.g. a memory chip) may store 3 bytes of the line. The $9^{th}$ memory device may be used to store an Error Correction Code (ECC). The nine memory devices that make up the rank may store large numbers of lines. Although a specific example of a rank of memory is described, it should be understood that the techniques described herein are not limited to any particular layout of memory devices in a rank.

The techniques described herein provide for receiving a line of data to be written to memory. The line may be examined to determine if the line can be compressed. If so, the line may be compressed, and a header describing the compression may be added to the line. An ECC for the overall line may be calculated. The compression may result in fewer than the total number of memory devices within the rank being needed to store the compressed line. As such, the memory devices that are not needed are not written, thus saving the write energy that would have otherwise been used to write to those devices. In some cases the data may be encrypted prior to being written to the memory devices.

The line that is stored may contain the data needed to determine if the line is compressed, and if so, how the line should be decompressed. For example, if the ECC does not use all bits available on the ECC storage device for the line, then the extra bits may be used to indicate if the line is compressed or not. In other implementations, different techniques, described below, may be used to determine if the line is compressed. When the data is to be read, it may be determined if the line is encrypted and/or compressed. The line may then be decrypted and/or decompressed and provided to the requestor.

The techniques described herein are Operating System (OS) independent and as such the OS is not required to have any knowledge of the compression occurring in the memory system. In other words the techniques described herein are completely transparent to the OS, applications, or other software running on the system. No OS application, or other code modification is required.

Figure 1:
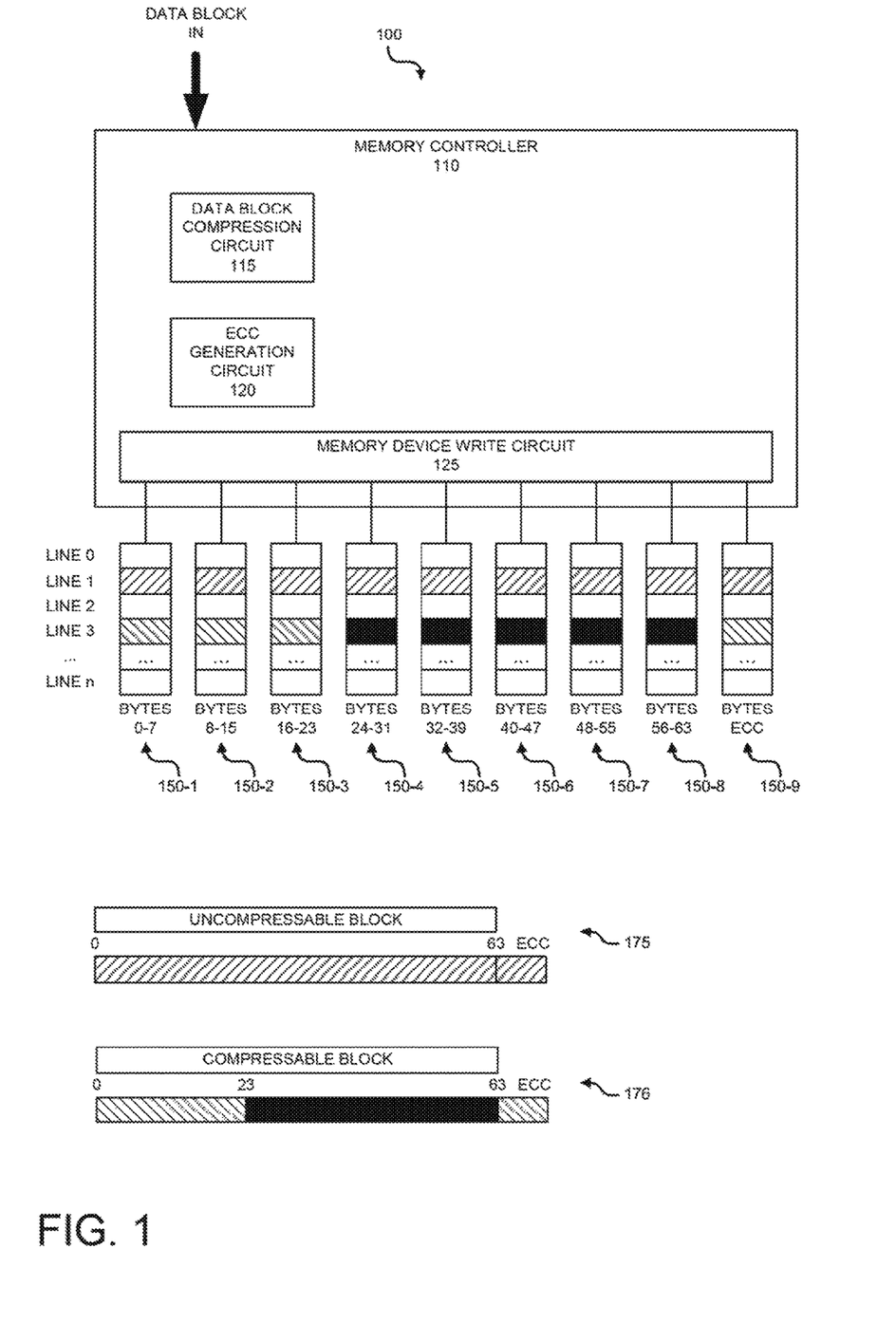
FIG. 1 depicts an example of a device that may use the data writing to a subset of memory devices techniques described herein.

FIG. 1 depicts an example of a device that may use the data writing to a subset of memory devices techniques described herein. System 100 may include a memory controller 110 coupled to a plurality of memory devices 150-1... 9. Although 9 memory devices are depicted, it should be understood that this is to aid in the description. The techniques described herein are not limited to any particular number of memory devices.

The memory controller 110 may be a device that is a standalone device, or it may be integrated within a larger device (e.g., a processor, part of a chipset). The techniques described herein, are not limited to any particular implementation. The memory controller may include a data block compression circuit 115, and ECC generation circuit 120, and a memory device write circuit 125. The memory controller and each of these circuits may be implemented as hardware circuits, or as a combination of hardware circuits and instructions readable and executable by the hardware circuits. For example, the memory controller may be implemented as logic on an integrated circuit, as an application specific integrated circuit (ASIC), as an FPGA, or in any other suitable manner.

The data block compression circuit may be a circuit to receive a block of data and compress that block of data. For example, the compression circuit may implement Base Delta Immediate (BDI) compression, which may allow a 64 byte data block to be compressed to a data block ranging from 0 to 64 bytes. Although a specific compression technique has been mentioned, the techniques described herein are not limited to any specific compression mechanism.

A block that cannot be compressed may be stored in raw form. A block that can be compressed may have a compression header generated by the compression circuit 115. The compression header may contain information that may be used to later assist in decompression. For example, the compression may indicate the process that was used to compress the data block and how that data block can be decompressed.

The ECC generation circuit 120 may be circuitry used to calculate an ECC for the block of data. The ECC may be used to determine if there has been an error in the data. Many ECCs can be used to correct for single bit errors and detect multiple bit errors. In some implementations, as will be described in further detail below, the ECC may be used to determine if the data block has been compressed. In the example being described, there are 8 bytes provided for an ECC. If the ECC being used does not use all 8 bytes, one or more bits may be used to indicate that the data block is compressed. The ECC generation circuit may insert those bits into the ECC in such implementations. These bits may be referred to as compression metadata. However, if the ECC uses all 8 bytes, an alternate mechanism for determining if the data block is encrypted is described below, with respect to FIG. 3.

The memory device write circuit 125 may be used to write bytes of data to memory devices. For example, the memory device write circuit may be coupled to memory devices that make up a rank of memory. When it is desired to write a line of data to the rank of memory, the memory device write circuit may write the line to the individual memory devices that make up the rank.

The system 100 may also include a plurality of memory devices 150-1 . . . 9 that make up a memory rank. System 100 is shown with a memory rank made up of 9 devices, however, it should be understood that this is for purposes of ease of description and not by way of limitation. The techniques described herein are suitable for use with memory ranks comprising any number of memory devices.

Each memory device may store a particular range of bytes for a given line. For example, memory device 150-1 may store bytes 0-7 for each line, memory device 150-2 may store bytes 8-15, and so on. The rank of memory may store any number of lines, as is shown by lines 1-n. The techniques described herein are not limited to ranks storing any particular number of lines. What should be understood is that a rank of memory may store many lines, and an individual memory device within the rank may store a portion of each line.

In operation, a request to write a block of data may be received by the memory controller. This is depicted by the "DATA BLOCK IN" arrow. At a high level, there are two possibilities when it comes to compressing, a block of data. The block is either compressible or it is not compressible. Each of these two situations is now described.

Assume the received block of data 175 is not compressible. As such, the data block compression circuit is not able to compress the data block. As mentioned above, uncompressible data blocks are stored in their raw form. In this case, the block of data is 64 bytes long and may be store uncompressed. The ECC generation circuit may generate an ECC over the 64 bytes and the ECC is appended to the line. The memory device write may then receive the uncompressed data block as well as the appended ECC and write the line to memory devices 150-1 . . . 9. As indicated by the matching hashes, the block of data 175 is show as being written to line 1 within the memory devices. It should be noted that is such cases, each memory device is written to, and as such write energy is used for writing to all 9 memory devices.

In the second case, the received block of data 176 may be compressible. In the example, assume that the compression circuit 115 is able to compress the data block to a smaller number of bytes. The compression circuit may then append a compression header to the compressed bytes. The compression header may be described as metadata that describes the compression. As shown by the hashes on line 176, assume that the compressed data and compression header uses bytes 0-23 (24 bytes total). The ECC may then generate and ECC covering the 24 bytes of compression header and data plus 40 bytes of padding.

The memory device write circuit may then write the compressed line to the memory devices. As shown, memory devices 150-1-3 in line 3 of the memory devices may be used to store the compression header and compressed data. The generated ECC may be stored in memory device 150-9. However, it is not necessary to write any data to memory devices 150-4-8, as indicated by the blacked out boxes. In comparison to the uncompressed case described above, only 4 memory devices instead of 9 are written to. As mentioned above, each write to a memory device requires write energy. By reducing the total number of memory devices written to, compression enables a reduction in the total amount of write energy needed to write a line of data.

In addition to reducing the amount of write energy needed, the techniques described herein also provide for a mechanism to reduce the amount of read energy needed when reading a line of data. This technique is described in further detail below, but what should be understood for now is that the portions of the line not written (e.g. the portions in black) are not use to store valid data. In other words, the portions of each line in black remain unused.

Figure 2:
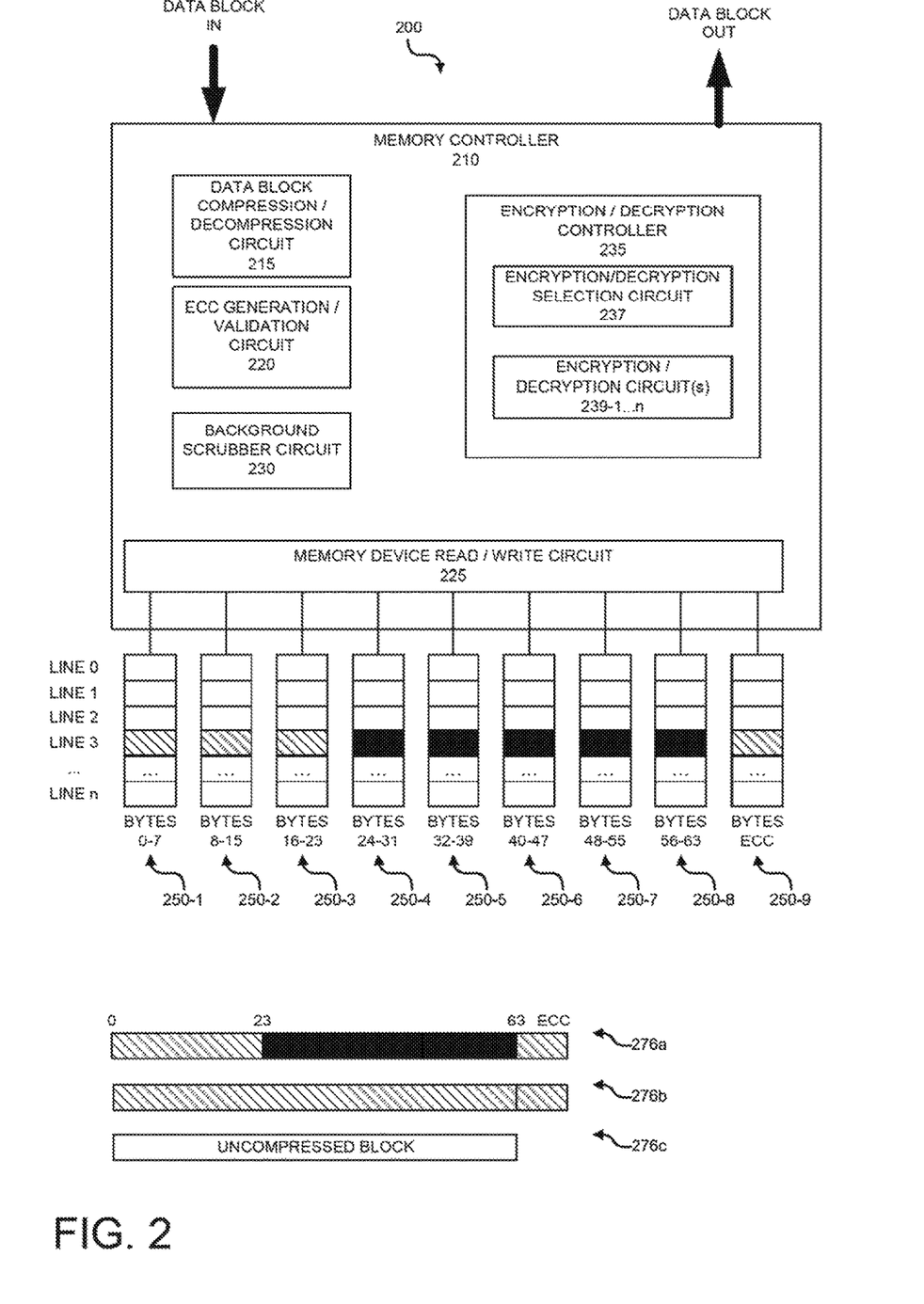
FIG. 2 depicts another example of a device that may use the data writing techniques described herein.

FIG. 2 depicts another example of a device that may use the data writing techniques described herein. Many of the elements of FIG. 2 are very similar to the elements in FIG. 1 and are similarly numbered. For ease of description, the description of those elements is not duplicated. System 200 may include a memory controller 220, which is very similar to memory controller 110. The memory controller may include a data block compression/decompression circuit 215, an ECC generation/validation circuit 220, a memory device write circuit 225, a background scrubber circuit 230, and an encryption/decryption controller 235. System 200 may also include memory devices 250-1 . . . 9, which are essentially the same as those described with respect to FIG. 1.

Data block compression decompression circuit 215 performs a similar function to the similarly numbered element in FIG. 1. In addition, circuit 215 may also perform decompression. For example, the circuit may use the compression header contained in a compressed line and use that information in order to decompress the compressed line back into the uncompressed block. Although circuit 215 is depicted as a single circuit performing both compression and decompression, it should be understood that this is only an example implementation. Other implementations may use different circuit to perform these functions.

System 200 may also include ECC generation/validation circuit 220. As above with respect to element 120, circuit 220 may generate an ECC to ensure that a line does not contain errors. Circuit 220 may also include functionality to validate the ECC. Circuit 220 may examine a line of data and validate that the ECC indicates that there are no errors in the line. As above, although depicted as a single generate/validate circuit, this is only an example implementation. Other implementations may use different circuits for each of these functions.

System 200 may also include a memory device read/write circuit 225. The memory device read/write circuit may be very similar to the equivalent circuit in FIG. 1, with the exception that the memory devices can be both read and written. The description is not repeated here. System 200 may also include a background scrubber circuit 230. The background scrubber circuit may examine the memory devices 250-1 . . . 9 as a task that runs continuously in the background, setting unused portions of lines to a high resistance state. As mentioned above, some portions of lines may remain unused (e.g. the black boxes). For some memory technologies (e.g. memristor), the amount of read energy used is dependent on the values stored at the designated location, and in the same array. Reads and writes to arrays with more high resistance values may require less energy to perform the read or write. For memory devices storing unused portions of the line, setting the resistance value to a high state reduces the amount of energy needed when reading or writing the line.

Although additional write energy is used when setting the memory devices to the high resistance states, this energy can be expended at a time that is convenient for the system. For example, assume that over a period of time there are a large number of memory writes. During such periods, reducing the overall amount of write energy would be useful, as reduction of energy usage in a system may be helpful. For example, reduction in energy usage may allow the system to remain below power usage caps. Thus, omitting the writes to unused devices would be helpful in ensuring the system stays within operating parameters (e.g. total energy usage). However, at a later time, there may not be many writes occurring. During these periods of time, the background scrubber circuit may operate. If the system load increases such that the background scrubber's energy usage becomes problematic, the system can temporarily halt the background scrubber circuit.

System 200 may also include an encryption/decryption controller 235. The encryption decryption controller may include an encryption/decryption selection circuit 237 and at least one encryption/decryption circuit 239-1 . . . n. The encryption/decryption controller may be used to encrypt and decrypt lines that are stored to the memory devices. The encryption may help improve security in the system. For example, as mentioned above, NVRAM may retain its contents even when power is no longer supplied. A malicious actor could physically steal one or more of storage devices 250-1 . . . 9. The data on these devices could then be retrieved by the malicious actor. By encrypting the data, it may be ensured that even in such a situation, the stolen devices would remain unreadable.

The controller 235 may include an encryption/decryption selection circuit. The encryption/decryption selection circuit 237 may be responsible for dividing up a data block into smaller blocks of a fixed size. In some cases, the smaller blocks may be padded with a value, such as 0. The circuit 237 may be used to divide up the block and pad as needed. Operation of the circuit 237 is described in further detail below, with respect to FIG. 3(a-c).

The controller 235 may also include at least one encryption/decryption circuit 239-1 . . . n. The encryption/decryption circuit 239 may be used to encrypt/decrypt the fixed size blocks of data generated by the circuit 237. In some cases, there may be a single circuit, and blocks are encrypted/decrypted serially. In other implementations, there may be multiple circuits 239, and encryption/decryption of the fixed size blocks may occur in parallel. Furthermore, although shown as a combined encryption/decryption circuit, it should be understood that this functionality may be divided into separate encrypt and decrypt circuits. What should be understood is that system 200 provides circuits to both encrypt and decrypt fixed size blocks of data.

Operation of system 200 will be described with reference to several examples. These examples will generally start with an uncompressed block of data, and will move through the process of compression, encryption, decryption, and decompression. However, every example, will not include every stage.

Continuing with example 176 from FIG. 1, assume that there is a compressed line 276a. The compressed line is also shown as line 3 in memory devices 250-1 . . . 9. In order to read the line, all 9 memory devices 250-1 . . . 9 may be read using the memory device read/write circuit. The data block compression/decompression circuit 215 may examine the compression metadata to determine if the line is compressed. For example, the bits taken from the ECC bytes above may be examined to determine if the block is compressed. If the line is not compressed, the ECC generation/validation circuit 220 may validate the line 276b by determining if the ECC indicates there are any errors. If no errors are present, the uncompressed line 276c may be sent out of the memory controller as indicated by the data block out arrow.

However, if it is determined that the line is compressed, the data block compression/decompression circuit 215 may examine the compression header metadata that was appended to the compressed line to determine how the line was compressed. The line may be padded based on the compression header and the ECC validated. If the line is valid the circuit 215 may decompress the line, resulting in an uncompressed line 276c. The uncompressed data block 276c may be sent as the data block out.

Figure 3A:
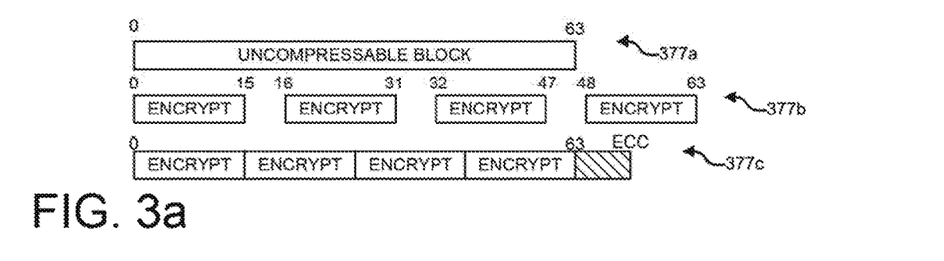

FIGS. 3(a-c) depict examples of write/read patterns in accordance with the data writing techniques described herein. FIGS. 3(a-c) continue with the examples that were started in FIGS. 1 and 2. FIG. 3a depicts the encryption process. For example, assume that an uncompressible block of data 377a is received. As should be understood, not all data blocks are able to be compressed. The case of a compressible data block is described further below. The encryption/decryption controller 235 may be used to encrypt the data block.

The encryption/decryption selection circuit 237 may divide the data block 377a into fixed size units. For example, the fixed size units may be 16 bytes each, resulting in the 64 byte data block being divided into 4 fixed size encryption blocks. The encryption/decryption circuit(s) 239-1 . . . n may then encrypt each of the fixed size blocks 377b. As mentioned above, if multiple encryption circuits are provided, the encryption of each block may occur in parallel. However, the techniques described herein are also suitable for use with a single encryption circuit, wherein the blocks are serially encrypted.

The ECC generation/validation circuit 220 may then generate an ECC to ensure that the line contains no errors. The ECC may be appended to the line 377c and the line stored in the memory devices. As indicated, because no compression was done, all memory devices are written and there is no saving of write energy. The process of decrypting the line is described in further detail below.

Figure 3B:
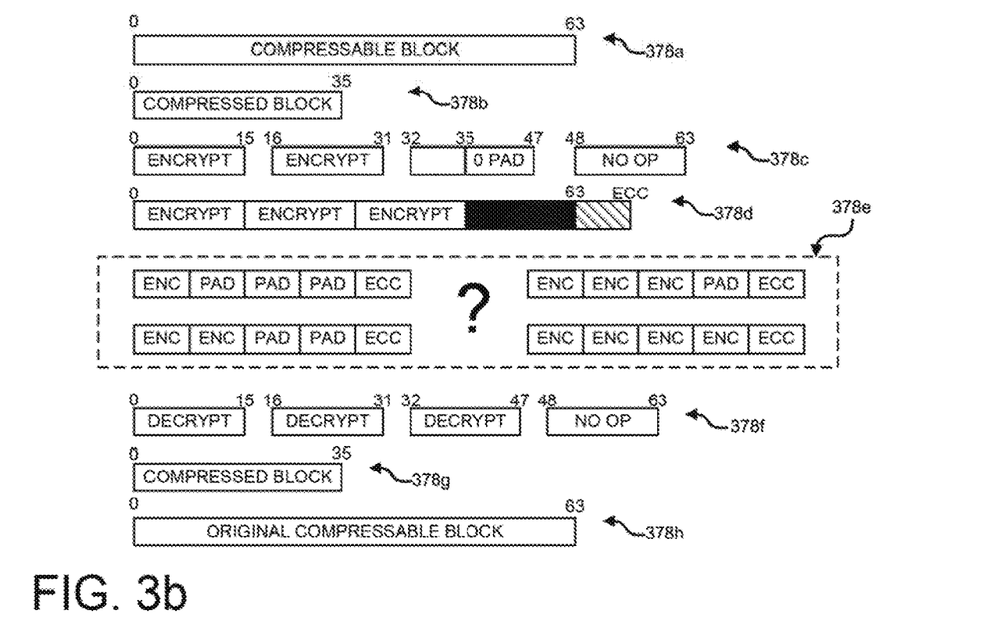

FIG. 3b depicts an example of receiving a compressible block of data, compressing the block, encrypting the block, decrypting the block, decompressing the block, and returning the original compressible block. As shown, a compressible block of data 378a may be received. The data block compression/decompression circuit 215 may be used to compress the data block and append a compression header 378b. In this example, the compressed data block and header is shown as being 36 bytes long.

The encryption/decryption selection circuit 237 may then divide the compressed block into fixed sized encryption units 378c. For example, the fixed size encryption units may be 16 bytes long. As shown, the compressed block may be divided into a first complete encrypt block for bytes 0-15 and a second complete encrypt block for bytes 16-31. The remaining bytes, 32-35 may then be padded (e.g. padded with zeroes) to result in a third encrypt block spanning bytes 32-47. It should be noted that no data is being stored in bytes 48-63. Blocks may then be encrypted by the encryption/decryption circuits 239-1 . . . n. It should be noted that the energy used in the encryption process may be reduced because the total number of blocks to be encrypted has been reduced. For example, unlike the case above with the uncompressible block where 4 blocks were encrypted, here, only 3 blocks are encrypted. Thus the energy used by the encryption blocks may be saved.

The ECC generation/validation circuit 220 may then generate an ECC to protect the line. For example, a 16 byte block of zeroes may be appended to the 3 encrypted blocks. An ECC may be generated and appended to the line 378d. The line may then be written to the memory devices by the memory device read/write circuit 225.

When encryption is performed, the mechanism for decrypting and decompressing the data is slightly different than that which was described above. For example, previously, some spare bits in the ECC bytes may have been used to identify if the block was compressed or not. If it was compressed, the compression header could be examined. However, this examination does not work in cases where the line is encrypted, because the compression header would be unreadable (e.g. it is encrypted). In other words, even if there were bits available in the ECC bytes to indicate the line was encrypted, the compression header could not be deciphered to determine how to decrypt the block. In addition, in some cases, the ECC may use all the available bytes and no spare bits may be available to determine if the line is encrypted.

In the current example, where a line is 64 bytes long, and the encryption block fixed size is 16 bytes, a compressed line may result in either 1, 2, 3 or 4 encrypted blocks. An uncompressed line results in 4 encrypted blocks. Thus, there are a finite number of bytes that are used. As mentioned above, an ECC is generated for the line, padding with zeroes as needed. The ECC generation/validation circuit 220 may attempt to validate the line under each of the four possible scenarios. As shown in 378e, the four possibilities may be 1) one encrypted block, three pad blocks 2) two encrypted blocks, two pad blocks, 3) three encrypted block, one pad block, and 4) four encrypted blocks. With selection of the right ECC it is highly unlikely that more than one of the four possibilities described above would be properly validated by the ECC. Thus, of the four possibilities, the one that is successfully validated determines how many encrypted blocks are present.

After the validation, the encryption/decryption selection circuit 237 may be made aware of how many encrypted blocks are in the line. The selection circuit may then cause the decryption circuits 239-1 . . . n to decrypt the determined number of encrypted blocks. Just as above in the encryption process, because a reduced number of decryptions may need to be performed, the energy used in decrypting may be reduced.

The encrypt/decrypt circuits 239-1 . . . n may then be used to decrypt the number of blocks 378f determined by the selection circuit 237. Once the decryption is complete, the compressed block 378g is recovered. At this point, the compression header is no longer encrypted, and can be retrieved from the compressed block. The data block compression/decompression circuit 215 may then be used to decompress the compressed block back to the original compressible block 378h. This step further confirms the size of the block estimated by the ECC validation circuitry.

Figure 3C:
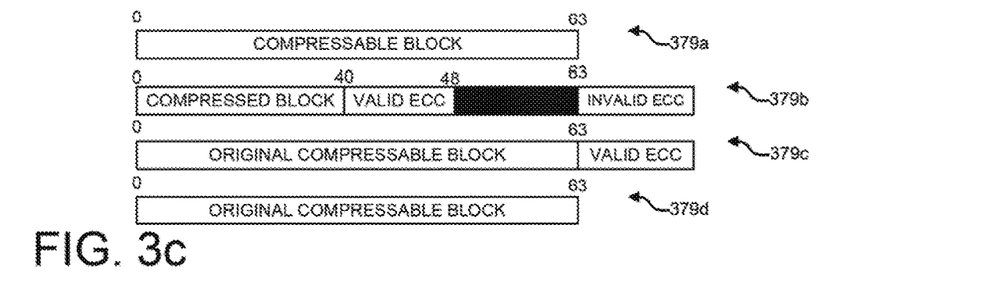

FIG. 3c describes an alternative mechanism to determine if a block has been compressed. As mentioned above, some ECCs may utilize all available space, leaving no bits available to indicate if a block is compressed or not. An alternative mechanism for determining the compression status of a data block may make use of an invalid ECC. Just as above, a compressible block 379a may be received. The compressible block may be compressed. For example, as shown, the compressed block (including compression header) may reside in bytes 0-40. A valid ECC covering those 40 bytes may then be generated and appended to the compressed block.

The valid ECC may be generated by either padding out the compressed block to the size needed by the ECC generation circuit 220. For example, if the ECC generation circuit expects a 64 byte block, then the compressed block can be padded with zeroes. In the alternative, an ECC that does not depend on a specific block size may be generated and data regarding the generation placed in the compression header.

An invalid ECC may then be generated. The invalid ECC may be guaranteed to fail. The compressed block (e.g. bytes 0-40), the valid ECC (e.g. bytes 41-48), unused devices (e.g. bytes 49-63), and the invalid ECC may be stored as a line 379b, in cases where some compression was possible. In cases where no compression is possible, the ECC generated would be the valid ECC to cover the full data block.

When attempting to retrieve the data block, the line containing the data is first read from all memory devices in the rank. The ECC validation circuit 220 attempts to validate the line. If the validation is successful, it means the line was uncompressed, and the data block can be sent out. However, if the ECC validation fails, it may mean that the line is compressed. The compression header may then be examined (perhaps after decryption) to determine how the line was compressed, where the valid ECC is located within the line, and how that ECC was generated 379c. The block may then be decompressed and validated using the valid ECC. The original uncompressed block may then be sent out.

Figure 4:
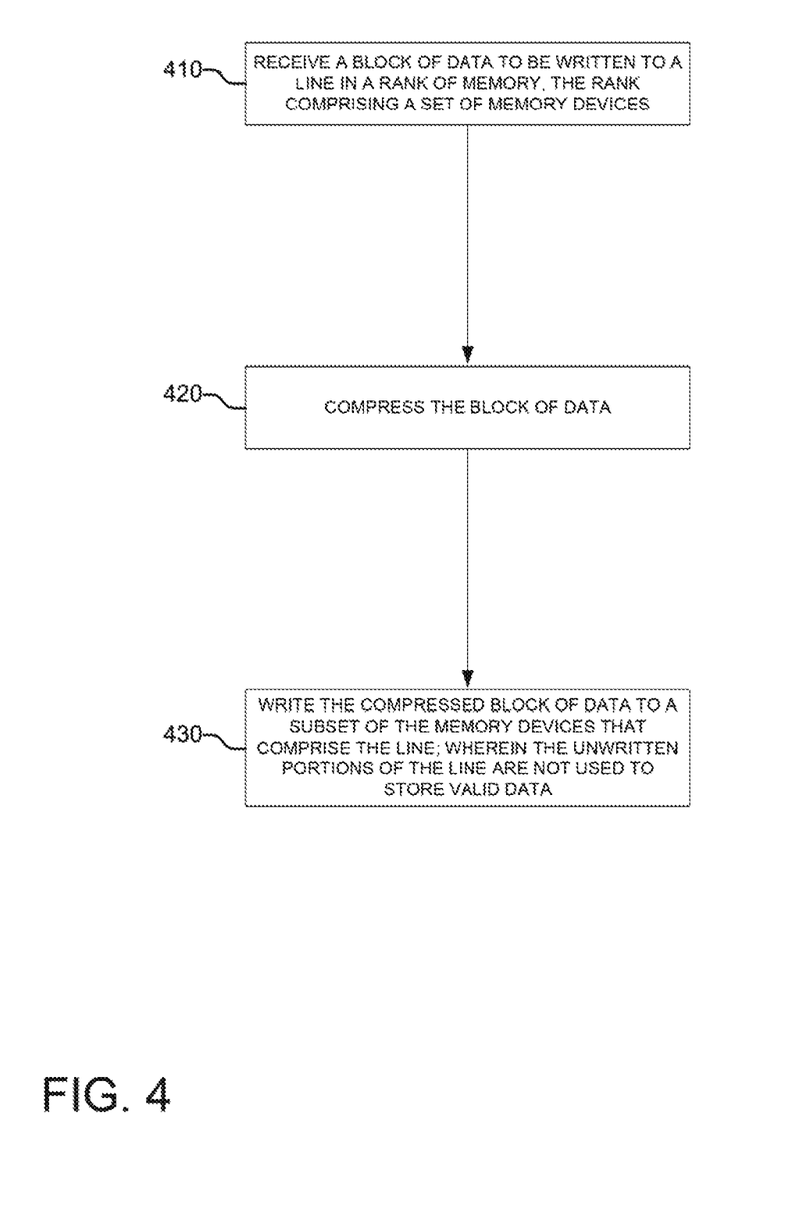
FIG. 4 depicts an example high level flow diagram of the data writing techniques described herein.

FIG. 4 depicts an example high level flow diagram of the data writing techniques described herein. In block 410, a block of data to be written to a line in a rank of memory may be received. The rank of memory may comprise a set of memory devices. As described above, the rank may be made up of any number of memory devices. The techniques described herein are not limited to a specific number of memory devices within a rank.

In block 420, the block of data may be compressed. As explained above, one possible compression mechanism is BDI compression. However, techniques described herein are not dependent on any particular compression mechanism. In block 430, the compressed block of data may be written to a subset of memory devices that comprise the line. The unwritten portions of the line are not used to store valid data. By writing the compressed block of data to a subset of memory devices, the total amount of write energy is reduced. Furthermore, by ensuring that the unwritten portions of the line are not used, there is no reason for the OS to be made aware of the compression. As far as the OS is concerned, each line stores one line sized block of data. The OS does not need to consider the possibility that a single line may hold data from two separate original blocks of data.

Figure 5A:
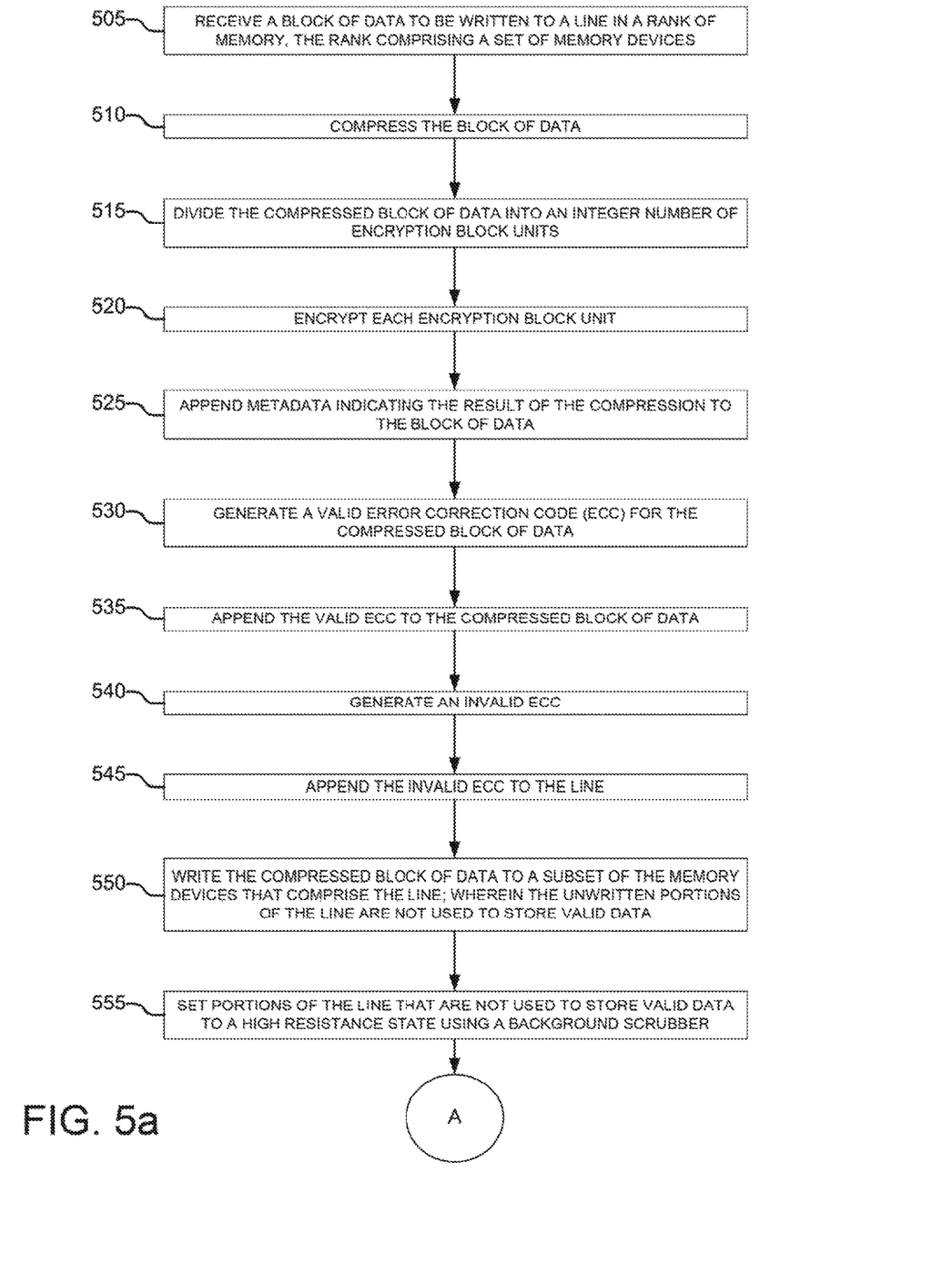
Figure 5B:
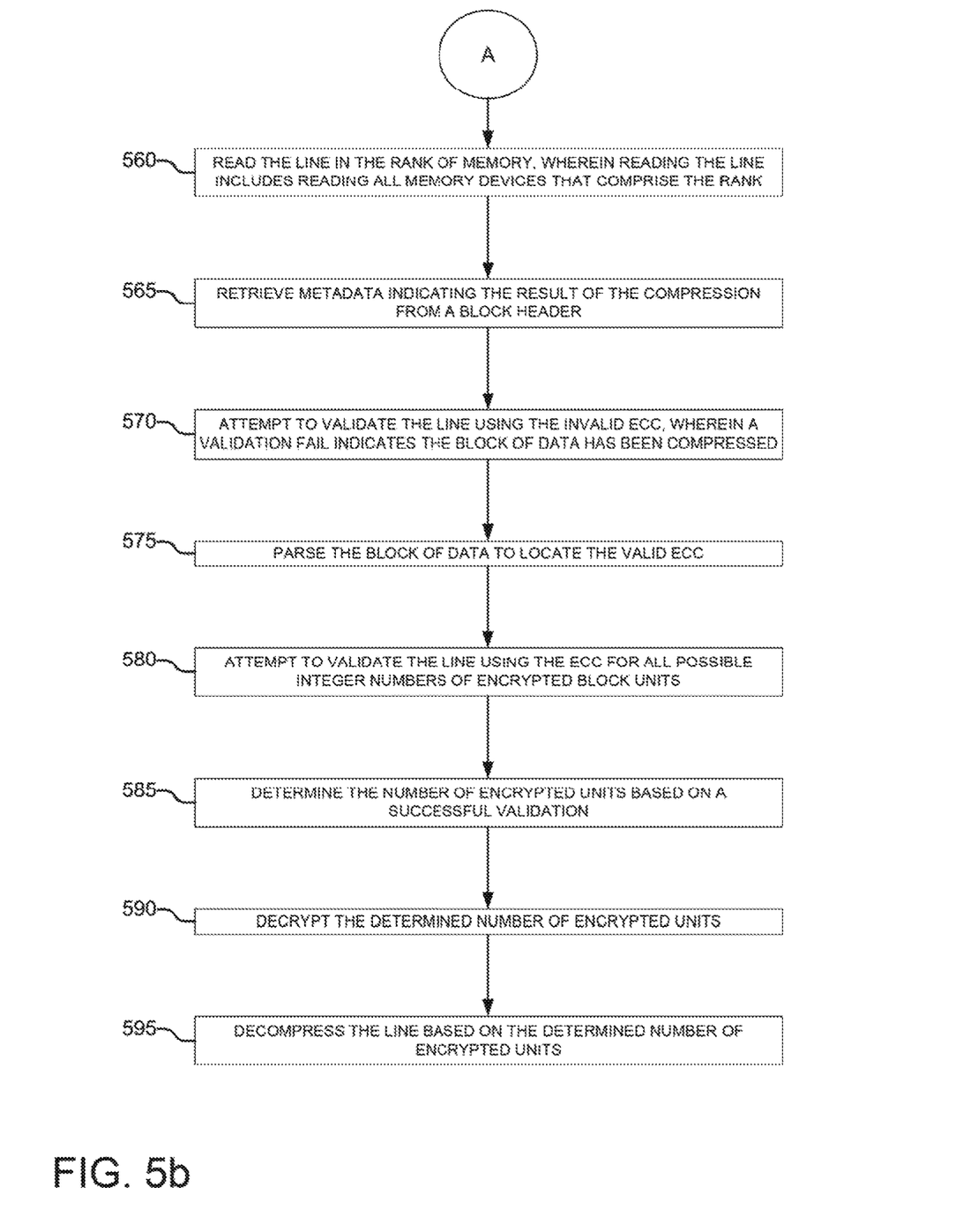

FIG. 5(a,b) depicts another example high level flow diagram of the data writing techniques described herein. In block 505, just as above in block 410, a block of data to be written may be received. In block 510, just as in block 420, the block of data may be compressed. In block 515, the compressed block of data may be divided into an integer number of encryption block units. As explained above, the encryption circuit may operate on a fixed size block. Thus, the compressed block may be divided in accordance with the fixed size block. As previously mentioned, blocks may be padded if necessary to arrive at the fixed encryption block size.

In block 520, each encryption block unit may be encrypted. The techniques described herein are not limited to any particular type of encryption. Any encryption mechanism is suitable for use with the techniques described herein. In block 525, metadata indicating the result of the compression may be appended to the block of data. This metadata may include the compression header or may include using spare bits within the ECC to indicate if the block is compressed. As explained above, the particular type of metadata used is dependent on if extra bits are available and if encryption is being used.

In block 530, a valid ECC may be generated for the compressed block of data. As mentioned above, the valid ECC may be used to verify a compressed line. In block 535, the valid ECC may be appended to the compressed block of data. In block 540, an invalid ECC may be generated. In block 545, the invalid ECC may be appended to the line. As mentioned above, if the ECC validation of the line fails, this may indicate that the line has been compressed.

In block 550, the compressed block of data may be written to a subset of the memory devices that comprise the line. The unwritten portions of the line may not be used to store valid data. In block 555, portions of the line that are not used to store valid data may be set to a high resistance state using a background scrubber. As described above, setting unused portions of a line to a high resistance state may reduce the amount or energy used during a read or write of the memory devices.

In block 560, a line in a rank of memory may be read. Reading the line may include reading all memory devices that comprise the rank. In other words, all memory devices, even those which may not be storing valid data for the line are read. In block 565, metadata indicating the result of the compression may be retrieved from a block header. As mentioned above, in the case of an unencrypted line, the compression header is readily available.

In block 570, an attempt to validate the line using the invalid ECC may be made. A validation fail may indicate that the block of data has been compressed. In block 575, the block of data may be parsed to locate the valid ECC. As mentioned above, the validation failure with the invalid ECC may indicate a compressed block. The location of the valid ECC may be determined by parsing the compression header to determine where the valid ECC is and how the block was compressed.

In block 580, the line may be validated using the ECC for all possible integer numbers of encrypted units. As described above, in the case of an encrypted line, there may be a limited number of possible encrypted blocks (e.g. 1, 2, 3, or 4). The validation attempts may be made on each of these limited possibilities, and a successful validation may indicate how many encrypted blocks are present. It should be understood that the above description is based on the 16 byte per encryption unit granularity. In some implementations, the determining granularity is the compression granularity. For example, the ECC check could be performed assuming one device, two devices, and so on, up to the maximum number of devices. The ECC check that succeeds may determine how compressed the block is. In block 585 the number of encrypted units may be determined based on the successful validation.

In block 590, the determined number of encrypted units may be decrypted. As described above, by only decrypting the number of encrypted units present, the energy used for decryption may be reduced. In block 595, the line may be decompressed based on the determined number of encrypted units.

We claim:

1. A method comprising:
receiving a block of data to be written to a line in a rank of memory, the rank comprising a set of memory devices;
compressing the block of data;
generating a valid Error Correction Code (ECC) for the compressed block of data;
appending the valid ECC to the compressed block of data;
generating an invalid ECC;
appending the invalid ECC to the block; and
writing the compressed block of data to a subset of the memory devices that comprise the line;
wherein the unwritten portions of the line are not used to store valid data.

2. The method of claim 1 further comprising:
setting portions of the line that are not used to store valid data to a high resistance state using a background scrubber.

3. The method of claim 1 further comprising:
reading the line in the rank of memory, wherein reading the line includes reading all memory devices that comprise the rank; and
decompressing the line.

4. The method of claim 1 further comprising:
dividing the compressed block of data into an integer number of encryption block units; and
encrypting each encryption block unit.

5. The method of claim 4 further comprising:
appending metadata indicating the result of the compression to the block of data.

6. The method of claim 5 wherein the metadata includes the valid error correction code (ECC), wherein the valid ECC is calculated based on the integer number of encryption block units.

7. The method of claim 6 further comprising:
attempting to validate the line using the valid ECC for all possible integer numbers of encryption block units;

determining the integer number of encryption block units based on a successful validation;

decrypting the determined integer number of encryption block units; and decompressing the line based on the determined integer number of encryption block units.

8. The method of claim 1 further comprising:

reading the line from the set of memory devices;

attempting to validate the line using the invalid ECC, wherein a validation fail indicates the block of data has been compressed;

parsing the block of data to locate the valid ECC; and retrieving metadata indicating the result of the compression from a block header.

9. A device comprising:

a data block compression circuit to compress a block of data and append a compression header to the compressed block of data;

an error correction code (ECC) generation circuit to generate a valid ECC, and an invalid ECC, for the block of data;

a memory device write circuit to write the compressed data block, the generated ECC, and the invalid ECC to a line in a memory rank, wherein the rank comprises a set of memory devices, and the memory device write circuit writes the line to a subset of the memory devices, wherein the portions of the line on unwritten memory devices are not used to store valid data.

10. The device of claim 9 further comprising:

a plurality of encryption circuits, each encryption circuit to encrypt a fixed number of bytes; and an encryption selection circuit to determine the number of encryption circuits needed to encrypt the compressed block of data, further to send the compressed block of data to the determined number of encryption circuits.

11. The device of claim 10 further comprising:

a plurality of decryption circuits, each decryption circuit to decrypt a fixed number of bytes; and a decryption selection circuit to determine the number of decryption circuits needed to decrypt the compressed block of data.

12. The device of claim 9 further comprising:

a scrubber circuit to set the portions of the line on unwritten memory devices not used to store valid data to a high resistance state.

13. A system comprising:

a rank of memory, the rank of memory comprising a plurality of memory devices; and a memory controller to compress a line of data; and an error correction code (ECC) generation circuit to generate a valid ECC, and an invalid ECC, for the line of data;

the memory controller to further write the compressed line of data, the generated ECC, and the invalid ECC to a subset of the memory devices comprising the rank, wherein unwritten memory devices for the line are not used to store valid data.

14. The system of claim 13 further comprising:

an encryption controller to encrypt/decrypt the compressed line; and a background scrubber to set unused portions of the line to a high resistance state.

\* \* \* \* \*